(12) United States Patent
Atanakovic

(10) Patent No.: US 7,416,959 B2
(45) Date of Patent: Aug. 26, 2008

(54) SILICON-ON-INSULATOR SEMICONDUCTOR WAFER

(75) Inventor: Petar B. Atanakovic, Palo Alto, CA (US)

(73) Assignee: Translucent Inc., Palo Alto, CA (US)

( * ) Notice: Subject to any disclaimer, the term of this patent is extended or adjusted under 35 U.S.C. 154(b) by 0 days.

(21) Appl. No.: 11/828,293

(22) Filed: Jul. 25, 2007

(65) Prior Publication Data
US 2008/0020545 A1 Jan. 24, 2008

Related U.S. Application Data

(62) Division of application No. 11/053,775, filed on Feb. 9, 2005, now Pat. No. 7,253,080.

(51) Int. Cl.
*H01L 21/30* (2006.01)

(52) U.S. Cl. ...................................... 438/455

(58) Field of Classification Search ................. 438/455
See application file for complete search history.

*Primary Examiner*—Carl Whitehead, Jr.
*Assistant Examiner*—Monica D Harrison
(74) *Attorney, Agent, or Firm*—Parsons & Goltry; Robert A. Parsons; Michael W. Goltry

(57) ABSTRACT

A method of fabricating a semiconductor-on-insulator semiconductor substrate is disclosed that includes providing first and second semiconductor substrates. Either oxygen or nitrogen is introduced into a region adjacent the surface of the first semiconductor substrate and a rare earth and hydrogen are implanted at different energy levels into the second semiconductor substrate to produce a rare earth rich region adjacent the surface and a hydrogen layer spaced from the surface. The surface of the first semiconductor substrate is bonded to the surface of the second semiconductor substrate in a process that includes annealing to react either the oxygen or the nitrogen with the rare earth to form an interfacial insulating layer of either rare earth oxide or rare earth nitride. During the anneal the hydrogen layer is blistered and a portion of the second semiconductor substrate is removed and the surface polished to form a thin crystalline active layer on the interfacial insulating layer.

14 Claims, 4 Drawing Sheets

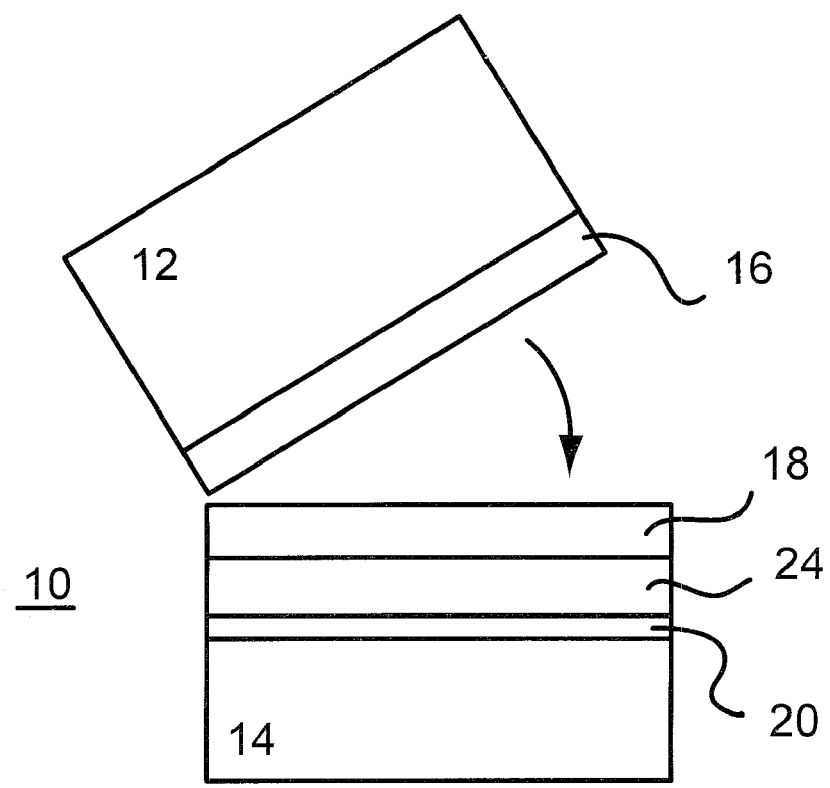
FIG. 4
FIG. 5
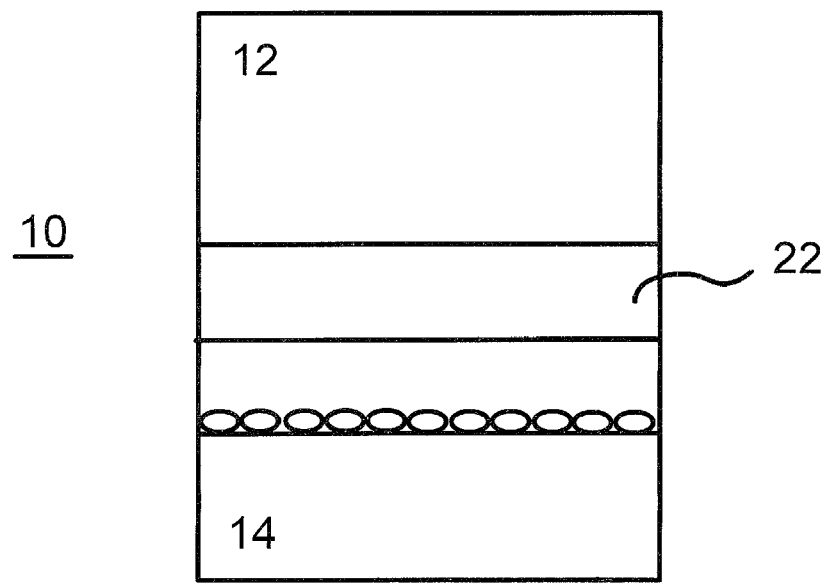

SILICON-ON-INSULATOR SEMICONDUCTOR WAFER

CROSS-REFERENCE TO RELATED APPLICATIONS

This application is a divisional application of currently pending U.S. application Ser. No. 11/053,775, filed 9 Feb. 2005.

FIELD OF THE INVENTION

This invention relates to crystalline silicon on an insulator layer for use in the semiconductor industry.

BACKGROUND OF THE INVENTION

In the semiconductor industry it is common to form a layer of crystalline silicon (generally referred to as an active layer) on an insulating layer to reduce any effects or interactions between the substrate (or handle wafer) on one side of the insulating layer and components formed on or in the crystalline layer on the other side of the insulating layer. At the present time the preferred insulating layer is formed of silicon dioxide ($SiO_2$) because of the ease in forming the layer and because bonding between the silicon dioxide and the silicon of the handle wafer is easy to achieve. In this disclosure the term "crystalline silicon" is used to denote a layer of silicon that is substantially single crystal material, i.e. as much of a single crystal as can be formed using present day techniques.

One common method of forming a silicon dioxide insulating layer between a substrate and a crystalline silicon layer is to provide two silicon substrates and form a layer of silicon dioxide on the surface of one of the substrate. At present the film of silicon dioxide is almost always formed by thermal oxidation, i.e. heating the substrate in a high humidity (such as steam). The silicon dioxide surface is then brought into contact with the surface of the second silicon substrate and forms a molecular bond through a well known process, referred to in the industry as Van der Waal bonding. One of the substrates is then partially removed by any of several different methods to leave a thin crystalline layer of silicon on the silicon dioxide layer. This in effect forms a buried oxide (BOX) insulator layer.

One method of removing a substantial portion of the substrate is to implant hydrogen, which is then annealed to form a weakened fracture plane. The substrate is then cleaved at the fracture plane and the surface is polished to a mirror surface using well known chemical mechanical polishing (CMP) techniques. Some methods have been introduced to improve the cleaving and polishing, see for example U.S. Pat. No. 6,372,609, entitled "Method of Fabricating SOI Wafer by Hydrogen ION Delamination Method and Wafer Fabricated by the Method", issued Apr. 16, 2002.

One problem with the crystalline silicon on a silicon dioxide insulating layer is the strain produced by stress introduced at the junction by the lattice mismatch between the silicon and the thermally formed silicon dioxide. The lattice mismatch results in a relatively high compressive stress at the junction between the two materials. In many instances this high stress can result in dislocations, crystalline defects, and even fractures in the active layer. Some components can be formed in the crystalline layer that use this compressive stress to an advantage, however, since the compressive stress will be across the entire wafer it will affect all components formed in/on the crystalline layer, many to a highly undesirable degree. To provide an unstressed or unstrained active layer, the thickness of the silicon dioxide layer must be severely limited to a thickness at which the stress substantially disappears. That is, in each atomic layer of the silicon dioxide a small amount of the stress can be removed by lattice matching until, ultimately, all stress is removed (stress distribution). An improved method of removing or engineering the stress is disclosed in a copending application, entitled "Silicon-on-Insulator Semiconductor Wafer", filed of even date herewith, and incorporated herein by reference.

When the active layer is stressed by forming it only on a silicon dioxide insulating layer it can not be treated as bulk silicon because it will be elastically deformed (i.e. strained) by the stress when the layer is too thin. If the stress is not removed or otherwise compensated, the crystalline silicon layer on the insulating layer must be made relatively thick to prevent elastic deformation. This means that transistors on/in the crystalline silicon layer are formed either partially depleted or substantial cost and effort must be expended to form a fully depleted crystalline silicon layer. Also, because the silicon dioxide layer allows some migration of impurities into the active layer from the substrate (handle wafer) both of the substrates must be high quality wafers, which adds substantial expense. Further, the silicon dioxide may contain impurities (e.g. hydrogen molecules introduced during the oxidation process) that can migrate into the active layer. Additionally, the silicon dioxide is a relatively poor insulator and allows leakage current to flow when used in transistors, CMOS circuits, and the like.

It would be highly advantageous, therefore, to remedy the foregoing and other deficiencies inherent in the prior art.

Accordingly, it is an object of the present invention to provide new and improved silicon-on-insulator semiconductor wafers or substrates.

Another object of the invention is to provide a new and improved silicon-on-insulator semiconductor wafer or substrate with an insulating layer that can be formed in an integral step with the formation of an active crystalline layer.

Another object of the invention is to provide new and improved silicon-on-insulator semiconductor wafers or substrates that can be formed thin enough to provide a fully depleted crystalline silicon layer above an insulating layer.

And another object of the invention is to provide new and improved silicon-on-insulator semiconductor wafers or substrates with an insulating layer that prevents impurities from migrating into the active layer and reduces leakage current in semiconductor devices.

Still another object of the present invention is to provide new and improved silicon-on-insulator semiconductor wafers or substrates that require fewer manufacturing steps and are less expensive.

SUMMARY OF THE INVENTION

Briefly, to achieve the desired objects of the instant invention in accordance with a preferred embodiment thereof, provided is a method of fabricating a semiconductor-on-insulator semiconductor substrate that includes providing first and second semiconductor substrates. Either oxygen or nitrogen is introduced into a region adjacent the surface of the first semiconductor substrate and a rare earth and hydrogen are implanted at different energy levels into the second semiconductor substrate to produce a rare earth rich region adjacent the surface and a hydrogen layer spaced from the surface. The surface of the first semiconductor substrate is bonded to the surface of the second semiconductor substrate in a process that includes annealing to react either the oxygen or the nitrogen with the rare earth to form an interfacial insulating layer of either rare earth oxide or rare earth nitride. During the anneal, the hydrogen layer is blistered and a portion of the second semiconductor substrate is removed and the surface polished to form a thin crystalline active layer on the interfacial insulating layer.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which:

FIGS. 4, 5, 6, and 7 are side views of the semiconductor substrates of FIG. 2 illustrating additional steps in the SOI fabrication process;

DETAILED DESCRIPTION OF A PREFERRED EMBODIMENT

Figure 1:
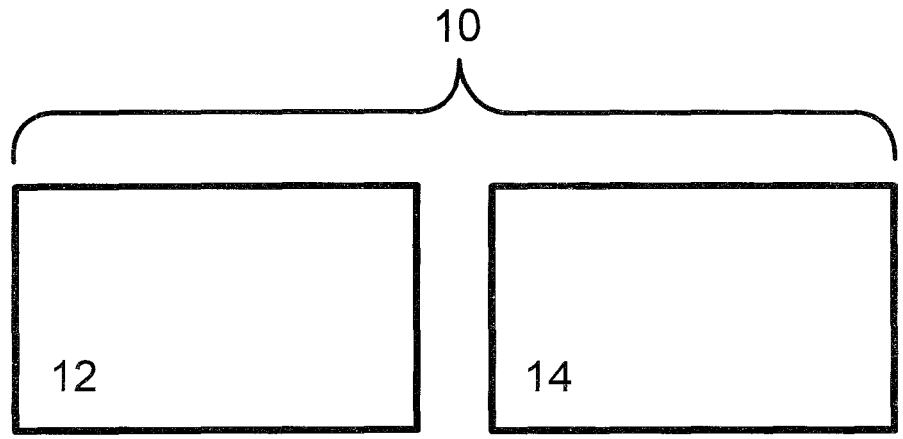
FIG. 1 is a simplified side view of a pair of silicon substrates illustrating a first step in a silicon-on-insulator (SOI) fabrication process in accordance with the present invention.

Turning now to the drawings, attention is first directed to FIG. 1, which illustrates a simplified side view of an interim point in a fabrication process in accordance with the present invention. Illustrated in FIG. 1 are a first silicon substrate 12 and a second silicon substrate 14, which are basic components of a silicon-on-insulator (SOI) wafer 10. As will be understood from the following description, substrate 12 is referred to as the handle substrate and substrate 14 is processed to produce an active layer of crystalline silicon. Under normal manufacturing procedures both substrates 12 and 14 are silicon wafers, although any size substrate or portion of a wafer could be used in the following procedures, if desired. Also, it will be understood that in some applications substrate 14 could be another semiconductor material.

Figure 2:
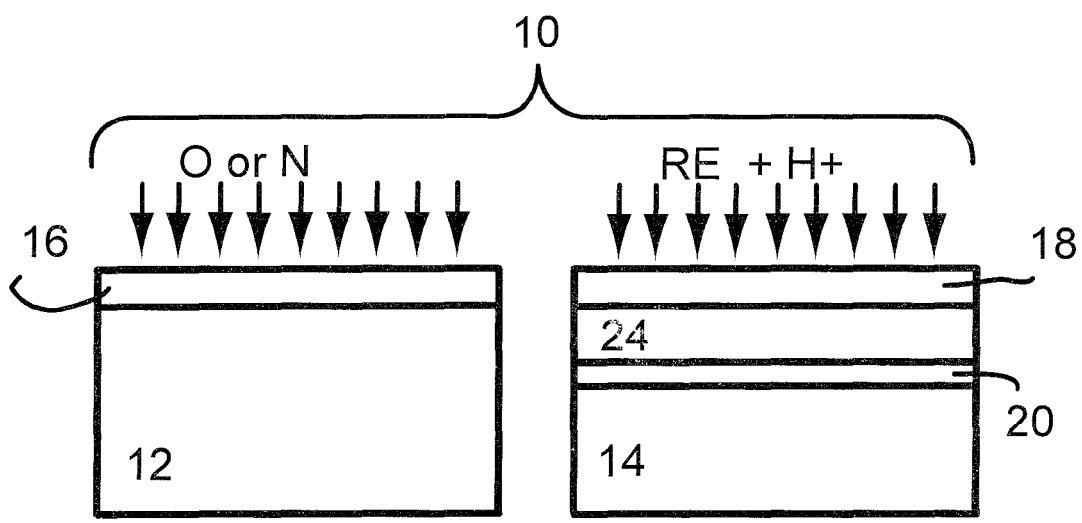
FIG. 2 is a view similar to FIG. 1 illustrating another point in the SOI fabrication process.

As shown in FIG. 2, substrate 12 is processed to produce a region or film 16 of oxygen or nitrogen rich silicon at one surface thereof. The process can be any well known process, such as low energy implanting or evaporation, to provide the oxygen or nitrogen close to the surface but generally un-reacted with the silicon.

Substrate 14 is implanted in a single step procedure with a rare earth and simultaneously with hydrogen (H+). The rare earth is implanted at a low energy level to produce a rare earth (RE) rich region or film 18 at the surface of substrate 14. The simultaneously implanted hydrogen (H+) is implanted with a higher energy level into substrate 14 to form a region or layer 20 spaced below region or film 18 a specified distance. It will be understood by those skilled in the art that the distance layer 20 is spaced below film 18 is determined by the implant energy or the implant energy levels of the different implanted materials used.

Figure 3:
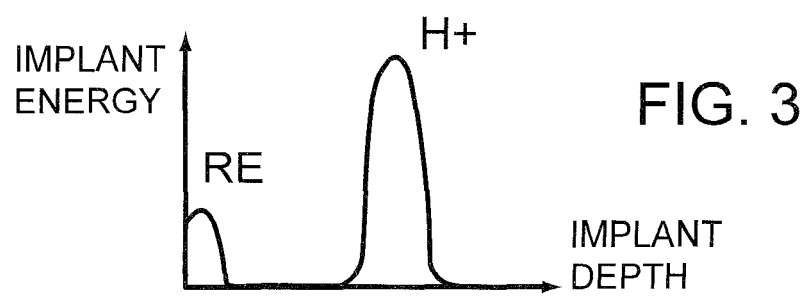
FIG. 3 is a graphical representation of the implant procedure.

A graphical presentation of the two different materials implanted at two different energies is provided in FIG. 3. Because the two implants are performed in a single step, the operation is simplified and requires fewer steps and cost. Also, it will be understood that the portion of substrate 14 between regions 18 and 20, designated 24 in FIG. 2, will ultimately be the crystalline silicon active layer in/on which components are formed and, therefore, is generally very thin (e.g. generally in a range of 150 to 500 angstroms). Thus, because of the difference in weight between the rare earth and the hydrogen, the hydrogen will be implanted deeper into substrate 14, even at the same implant energies.

Thus, in some instances, such as for a very thin layer 24 and some of the higher weight rare earths, it may be possible to implant the rare earth and the hydrogen at substantially the same implant energies. In these instances the hydrogen peak illustrated in FIG. 3 might slightly, or completely, overlap the rare earth peak. Thus, it should be understood that for purposes of this invention the term "energy level" includes a combination of the implant energy and the weight of the material being implanted. For example, at a given implant energy the lighter hydrogen will have a higher energy level and be implanted deeper while the heavier rare earth will have a lower energy level and remain near the surface.

Because the rare earth is implanted at a low energy level it resides close to the surface of substrate 14 but remains generally un-reacted with the silicon. While any of the materials known as 'rare earths' can be used, two preferred examples are Erbium (Er) and Ytterbium (Yb). Other typical examples of rare earth materials that can be used in this application are described in U.S. Provisional Application No. 60/533378, filed 29 Dec. 2003, incorporated herein by reference. Generally, region 16 will be much thinner than region 18.

Referring additionally to FIG. 4, substrates 12 and 14 are placed in overlying relationship with the surface of oxide rich region 16 in abutting engagement with the surface of rare earth rich region 18. It will be understood that bringing the surfaces of substrates 12 and 14 into engagement produces a natural molecular bonding, commonly referred to in the industry as Van der Waal's bonding. The combined substrates are then annealed at a temperature less than approximately 1000 degrees Centigrade, which further enhances the bonding and forms blistering in hydrogen layer 20, as illustrated in simplified FIG. 5. The annealing step causes the oxygen or nitrogen in region 16 (i.e. adjacent the surface of substrate 12) to react with the rare earth in region 18 (i.e. adjacent the surface of substrate 14) to form a highly insulating layer 22 of rare earth oxide or nitride. Here it should be understood by those skilled in the art that the annealing step need only be at a sufficiently high temperature to produce the blistering in hydrogen layer 20, since the rare earth and oxygen or nitrogen will react at relatively low temperatures. Also, in many instances the rare earth oxide or nitride reaction can produce an interfacial single crystal material, e.g. RE oxide or RE nitride in crystalline form. The single crystal material is preferred, but not necessary, because of the better lattice matching with substrates 12 and 14 and because of the better insulating properties.

Figure 6:
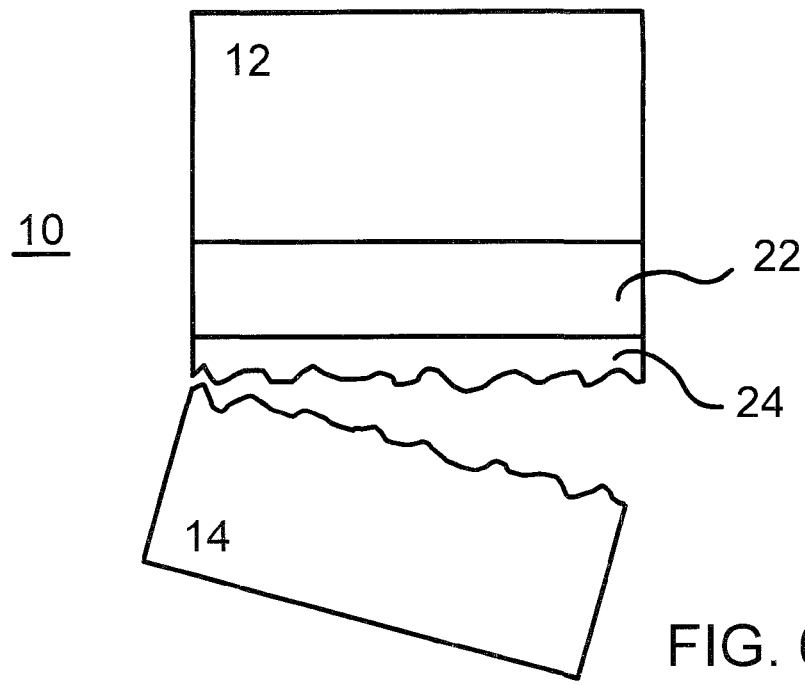
Figure 7:
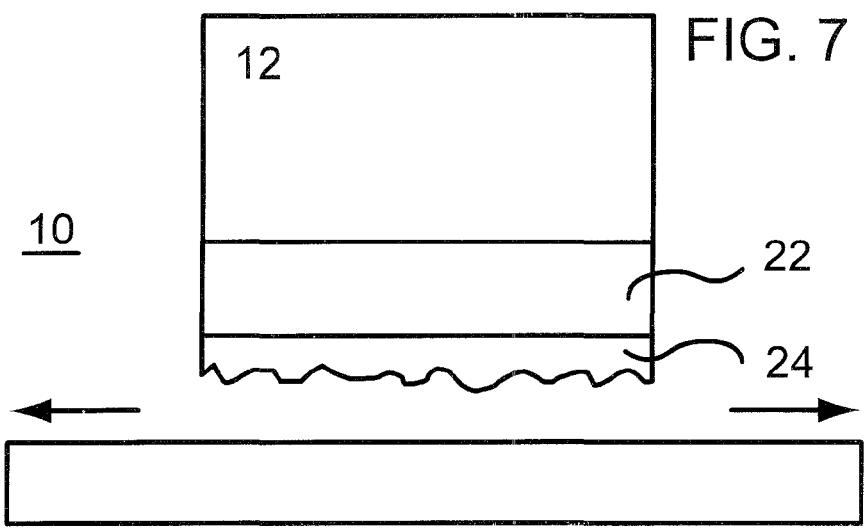
Figure 8:
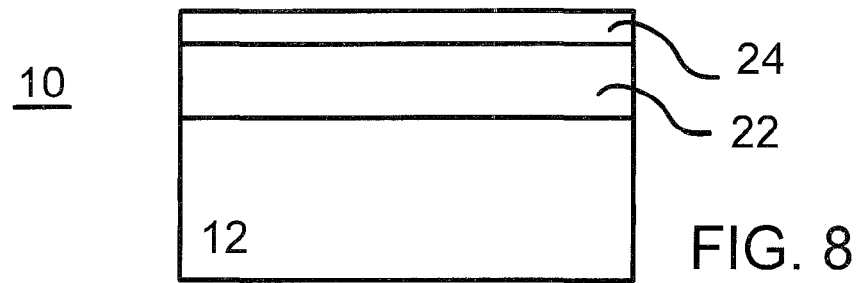
FIG. 8 is a side view of a silicon-on-insulator wafer or substrate, fabricated in accordance with the present invention, which can be used to produce fully depleted transistors.

The blistering of hydrogen layer 20 produces a weakened fracture plane, which can then be cleaved, as illustrated in FIG. 6, to remove all of substrate 14 except the active layer, designated 24 in FIG. 6. The surface of active layer 24 is then polished by any convenient method (e.g. CMP, which denotes chemical-mechanical-polish), as illustrated diagrammatically in FIG. 7, to produce a smooth crystalline surface, illustrated in FIG. 8. By properly selecting the rare earth introduced into region 18 when forming insulating layer 22, any stress in layer 22 can be substantially removed so that active layer 24 is freestanding (i.e. unstressed) and can, therefore be formed as thin as desired (e.g. in a range of 150 to 500 angstroms). That is, if active layer 24 were stressed by forming it only on, for example, a silicon dioxide layer it could not be treated as bulk silicon because it would be elastically deformed (i.e. strained) by the stress when the layer is too thin. Alternatively, by properly selecting the rare earth introduced into region 18 when forming insulating layer 22, any desired stress can be formed in layer 22 to provide higher performance of semiconductor components formed in/on layer 24.

Figure 9:
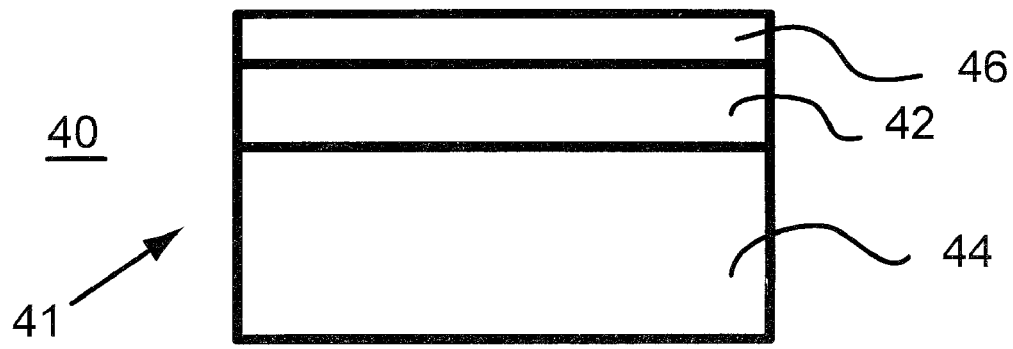
FIG. 9 is a simplified side view illustrating a first step in another embodiment of a silicon-on-insulator (SOI) fabrication process in accordance with the present invention.

Turning now to FIG. 9, a first step is illustrated in another embodiment of a silicon-on-insulator (SOI) fabrication process for fabricating a silicon-on-insulator (SOI) wafer 40 in accordance with the present invention. In an initial step, a wafer, designated 41, is provided that includes a buried oxide or nitride (generally, silicon oxide or silicon nitride) layer 42 on a substrate 44 with an active crystalline silicon layer 46 in overlying relationship. Here it will be understood that wafer 41 can be formed using any of the well known prior art methods, including the hydrogen implant and cleaving method described above, and for a clearer understanding only layer 42 is described as being positioned adjacent the surface of wafer 41. Also, because active crystalline silicon layer 46 is formed on buried silicon oxide or silicon nitride layer 42, which includes all of the stress previously discussed, layer 46 will generally be thicker than desired.

Figure 10:
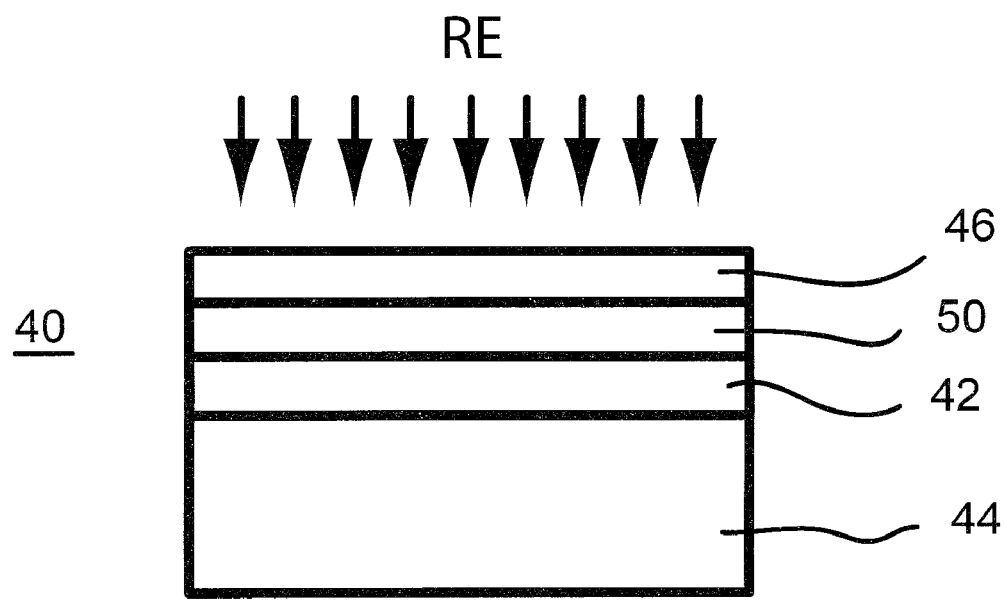
FIG. 10 illustrates additional steps in the SOI fabrication process.

Referring additionally to FIG. 10, a rare earth is implanted into buried silicon oxide or silicon nitride layer 42 through active crystalline silicon layer 46. While any of the materials known as 'rare earths' can be used, two preferred examples are Erbium (Er) and Ytterbium (Yb). Other typical examples of rare earth materials that can be used in this application are described in the copending United States patent application described above. Once the rare earth is implanted into layer 42 of wafer 41, it is annealed to cause the rare earth to react with the oxide or nitride to produce a layer 50 of rare earth oxide or rare earth nitride. Depending upon the rare earth implanted, the amount implanted and the anneal process, layer 50 can be single crystal or amorphous. Also, during the anneal process any damage that might have been done to active crystalline silicon layer 46 by the implant process can be healed to return layer 46 to a single crystal silicon layer.

Depending upon the implant process (e.g. the amount of material implanted and the implant energy), silicon oxide or silicon nitride layer 42 can be partially or completely converted to layer 50 of rare earth oxide or rare earth nitride. Also, layer 50 can be, preferably, situated adjacent the upper surface of layer 42 or it can be situated anywhere within layer 42. Because the lattice structure of the rare earth oxide or rare earth nitride more closely matches the lattice structure of active crystalline silicon layer 46, the stress between layers 50 and 46 is substantially reduced and the thickness of layer 46 can be reduced (e.g. by CMP) to provide a fully depleted crystalline silicon layer above an insulating layer (e.g. in a range of 150 angstroms to 500 angstroms). Further, the rare earth oxide or rare earth nitride layer (layer 50) is an insulating layer that prevents impurities from migrating into the active layer and reduces leakage current in semiconductor devices.

Thus, new and improved methods of fabricating semiconductor-on-insulator semiconductor wafers have been disclosed. The new and improved methods of fabricating semiconductor-on-insulator semiconductor wafers may be used, generally, in producing a large variety of semiconductor products. Because the rare earth and hydrogen are implanted in a single process step in one of the processes, the process is greatly simplified, thereby substantially reducing the cost. Also, the RE oxide or RE nitride layer can be formed very thin and because it includes higher quality insulating material, such as nitrides and rare earths, the wafers can be used to manufacture high quality and very small field effect transistors, CMOS circuits, and the like. Further, because the insulating layer 22 contains a rare earth oxide or a rare earth nitride, impurity diffusion from the handle wafer (Substrate 12 in this example) is reduced or eliminated so that a lower quality handle wafer can be used, thereby resulting in additionally reduced cost. As will be understood by those skilled in the art after a careful reading of the description, fewer process steps are required in the fabrication of the fully depleted silicon-on-insulator substrate or wafer and the process is not only simple but cost effective.

Various changes and modifications to the embodiment herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

The invention claimed is:

1. A method of fabricating a semiconductor-on-insulator semiconductor substrate comprising the steps of:
   providing a first crystalline silicon substrate with a surface;
   implanting one of oxygen and nitrogen into a region adjacent the surface of the first silicon substrate;
   providing a second crystalline silicon substrate with a surface;
   implanting a rare earth into a region adjacent the surface of the second silicon substrate and simultaneously implanting a layer of hydrogen into the second silicon substrate, the hydrogen layer being spaced from the region of rare earth in the second silicon substrate;
   bonding the surface of the first silicon substrate to the surface of the second silicon substrate including annealing to react the one of oxygen and nitrogen in the region adjacent the surface of the first silicon substrate with the rare earth in the region adjacent the surface of the second silicon substrate to form an interfacial insulating layer of one of rare earth oxide and rare earth nitride and the annealing also blistering the hydrogen layer; and
   removing a first portion of the second semiconductor substrate by cleaving at the hydrogen layer thereby leaving a second portion of the second semiconductor substrate with a surface; and
   processing the surface of the second portion of the second semiconductor substrate to form a thin crystalline active layer on the interfacial insulating layer.

2. A method as claimed in claim 1 wherein the step of annealing includes annealing at a temperature less than 1000 degrees centigrade.

3. A method as claimed in claim 1 wherein the steps of providing the first silicon substrate and providing the second silicon substrate include providing a high quality silicon substrate for the first silicon substrate and providing a lower quality silicon substrate for the second silicon substrate.

4. A method as claimed in claim 1 wherein the step of implanting the rare earth includes implanting one of Erbium (Er) and Ytterbium (Yb).

5. A method as claimed in claim 1 wherein the thin crystalline silicon layer is formed thin enough to provide fully depleted semiconductor components.

6. A method as claimed in claim 5 wherein the thickness of the crystalline silicon layer is in a range of 150 angstroms to 500 angstroms.

7. A method as claimed in claim 1 wherein the step of implanting the rare earth and the hydrogen is performed using different energy levels for the rare earth and the hydrogen.

8. A method as claimed in claim 1 wherein the step of implanting the rare earth and the hydrogen is performed using first implant energy for the rare earth and a second implant energy, higher than the first implant energy for the hydrogen.

9. A method as claimed in claim 1 wherein the step of annealing to react the one of oxygen and nitrogen with the rare earth is sufficient to produce a layer of single crystal rare earth oxide or single crystal rare earth nitride.

10. A method of fabricating a semiconductor-on-insulator semiconductor substrate comprising the steps of:

providing a crystalline silicon substrate with a surface, an insulating layer including one of an oxide and a nitride in a region adjacent the surface of the silicon substrate, and a crystalline layer of silicon in overlying relationship on the insulating layer;

implanting a rare earth into the insulating layer; and annealing the crystalline silicon substrate, the insulating layer with implanted rare earth, and the crystalline layer of silicon to cause the rare earth and the one of the oxide or the nitride to combine to form a layer of one of a rare earth oxide and a rare earth nitride.

11. A method as claimed in claim 10 wherein the layer of one of the rare earth oxide and the rare earth nitride is formed in abutting engagement with the crystalline layer of silicon.

12. A method as claimed in claim 10 wherein the step of annealing includes forming the layer of one of the rare earth oxide and the rare earth nitride into a single crystal layer.

13. A method as claimed in claim 10 including in addition a step of processing the crystalline layer of silicon to provide a fully depleted crystalline silicon layer overlying the insulating layer.

14. A method as claimed in claim 13 wherein the step of processing the crystalline layer of silicon includes reducing the thickness to a range of 150 angstroms to 500 angstroms.

* * * * *